United States Patent [19]

Christopher

[11] Patent Number: 4,731,844

[45] Date of Patent: Mar. 15, 1988

[54] APPARATUS FOR CANCELLING A PILOT SIGNAL FROM A COMPOSITE SIGNAL

[75] Inventor: Todd J. Christopher, Indianapolis, Ind.

[73] Assignee: RCA Corporation, Princeton, N.J.

[21] Appl. No.: 882,384

[22] Filed: Jul. 7, 1986

[51] Int. Cl.[4] ............................................... H04H 5/00
[52] U.S. Cl. ......................................................... 381/13
[58] Field of Search ............... 329/122, 123, 124, 126; 381/4, 13, 3, 12

[56] References Cited

U.S. PATENT DOCUMENTS

| | | | |
|---|---|---|---|
| 4,300,020 | 11/1981 | Toyomaki | 179/1 |
| 4,306,112 | 12/1981 | Ueno | 381/13 |
| 4,404,430 | 9/1983 | Ogita | 179/1 |
| 4,409,436 | 10/1983 | Numata et al. | 381/15 |
| 4,561,113 | 12/1985 | Naito | 381/13 |
| 4,680,792 | 7/1987 | Tanaka et al. | 381/13 |

OTHER PUBLICATIONS

J. K. J. van Ginderdeuren et al, "Compact NMOS Building Blocks and a Methodology for Dedicated Digital Filter Applications", IEEE JSSC, vol. SC-18, No. 3, Jun. '83, pp. 306-315.

*Primary Examiner*—Forester W. Isen
*Attorney, Agent, or Firm*—Eugene M. Whitacre; Paul J. Rasmussen; Eric P. Herrmann

[57] ABSTRACT

Pilot signal cancelling circuitry for removing the pilot signal from a composite signal, includes a subtraction circuit. The composite signal and a synthesized pilot signal are coupled to the minuend and subtrahend input connections of the subtraction circuit respectively. The output of the subtraction circuit is coupled to first and second multipliers. A cosine signal of like frequency to the pilot signal is applied to the first multiplier which develops a phase error signal. The phase error signal is coupled to an oscillator which develops the cosine signal. A sinusoidal signal, also developed by the oscillator and in phase with the pilot signal is applied to a second multiplier. The second multiplier generates a signal proportional to the amplitude of the residual pilot signal in the output signal provided by the subtraction circuit. The amplitude signal is multiplied by a sinusoid in phase with the pilot signal in a third multiplier to generate the synthesized pilot signal.

5 Claims, 5 Drawing Figures

APPARATUS FOR CANCELLING A PILOT SIGNAL FROM A COMPOSITE SIGNAL

This invention relates to apparatus for cancelling pilot signal components from composite signals such as baseband audio stereo signals.

BACKGROUND OF THE INVENTION

Typical baseband composite audio stereo signals include a main signal formed from the sum of the left and right channel signals (L+R), a pilot signal having a frequency $\omega_p$ which is greater than the maximum frequency of the (L+R) signal, and a difference signal (L−R) which is the difference between the left and right channel signals. The difference signal is in the form of a double sideband, amplitude modulated suppressed carrier centered at a frequency of twice $\omega_p$. The pilot signal is essential for demodulating the suppressed carrier to extract the (L−R) audio information.

The demodulated (L−R) signal will nominally include a component c−orresponding to the pilot signal, and the maximum signal frequency of the (L+R) signal is nominally relatively close to the pilot signal frequency. The pilot signal must be removed from both the (L−R) and the (L+R) signals to preclude it from introducing undesirable high frequency tones in the reproduced sound signals. The pilot signal may be removed by suitable low-pass filters, however, to do so requires filters with relatively sharp cutoff characteristics. Such filters are complex and, therefore, undesirably expensive for application in consumer products.

Minoru Ogita in U.S. Pat. No. 4,404,430 entitled "FM Stereo Demodulation Circuit With Voltage Dividing And Multiplexing Techniques", disclosed alternate pilot signal cancelling apparatus wherein a synthesized pilot signal is generated and subtracted from the composite audio signal. In the Ogita apparatus the pilot signal is cancelled at a point in the circuitry subsequent detection of the phase of the pilot signal for generating a clock signal to demodulate the suppressed carrier.

At the present state of the art of integrated circuit fabrication it is practical to implement substantially the entirety of audio processing circuitry on a single silicon integrated circuit die. To do so, however, it is desirable to constrain certain signal parameters within limits to reduce power consumption or the actual number of devices on the die. The former limitation is important for analog integrated circuit designs and the latter is important for digital integrated circuit designs. The constraints may be satisfied for both cases if the peak amplitude of the composite signal is reduced. This reduction may be effected by cancelling the pilot signal prior to the bulk of the signal processing apparatus including phase detection of the pilot signal. While it may seem contradictory to be able to accomplish detection of the phase of the pilot signal after the pilot signal is cancelled, it will be demonstrated in the following description of the present invention that such is possible.

SUMMARY OF THE INVENTION

The present pilot signal cancelling system includes a signal subtraction circuit having a first input terminal coupled to receive composite signal and a second input terminal for applying a synthesized pilot signal. Reference signal generating circuitry for generating a signal phase locked to the pilot signal is coupled to the output of the subtraction circuit. Circuitry for detecting the amplitude of residual pilot signal is coupled to the output of the subtraction circuit. Sinusoidal signal generating circuitry responsive to the detected amplitude of the residual pilot signal and the reference signal generating circuitry develops a synthesized pilot signal which is coupled to the subtraction circuit to cancel the pilot signal from the composite signal.

BRIEF DISCRIPTION OF THE DRAWING

DETAILED DESCRIPTION

The invention will first be described in a general context applicable to either analog signals or sampled data analog or digital signals with reference to FIG. 1. A specific embodiment directed to processing sampled data serial-bit digital signals will thereafter be described with reference to the remaining figures.

Figure 1:
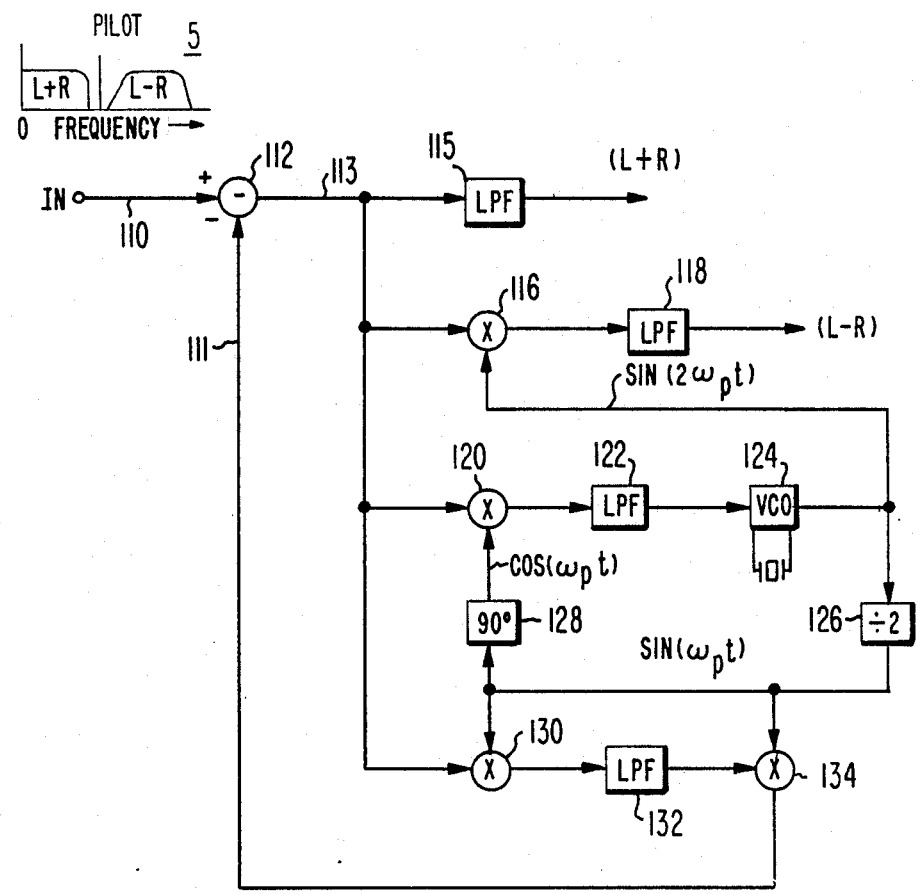
FIG. 1 is a block diagram of apparatus for processing a composite signal including pilot signal cancelling circuitry embodiment of the present invention.

In FIG. 1, a composite signal having a frequency composition similar to the spectral waveform 5 is applied at terminal 110 and coupled to the minuend input terminal of the signal subtraction circuit 112. A synthesized pilot signal is coupled via connection 111 to the subtrahend input terminal of subtraction circuit 112. Subtraction circuit 112 provides the composite signal, with the pilot signal substantially eliminated, at its output connection 113. The output signal from subtraction circuit 112 is coupled to a low-pass filter 115 which passes the (L+R) signal to the substantial exclusion of higher frequency components of the composite signal. Since the pilot signal is not present in the signal applied to filter 115, the frequency cut off characteristics of filter 115 are significantly less critical than if the pilot signal were present.

The output signal from subtraction circuit 112 is also coupled to one input of a multiplier circuit 120. The output developed by the multiplier 120 is coupled to the serially connected circuit elements including a low-pass filter 122, a voltage controlled oscillator (VCO) 124, divider circuit 126 and a 90° phase shifter 128. The low-pass filter 122 integrates the output of multiplier 120 over an interval relatively long compared to the period of the pilot signal to produce a signal corresponding to the average value of the multiplier output signal. The output from the low-pass filter 122 is coupled to the control input terminal of the VCO 124 to adjust the output frequency produced thereby. For a zero valued control signal, VCO 124 develops a sinusoidal output signal $\sin(2\omega'_p t)$ having a frequency substantially equal to twice the frequency, $\omega_p$, of the pilot signal. The output signal from VCO 124 is applied to the frequency divider 126 which develops a sinusoidal signal, $\sin(\omega'_p t)$, equal in frequency, and phase locked to the pilot signal. The output of the frequency divider 126 is coupled to the phase shifter 128 which develops a sinusoidal signal of frequency $\omega'_p$ and shifted in phase relative to the pilot signal by 90°, which signal corresponds to $\cos(\omega'_p t)$ It will now be demonstrated that the phase locked loop including elements 120-128 operates as described above when the pilot signal is cancelled by the subtraction circuit 112. Standard FM and BTSC baseband composite audio signals, C(t), can be described by the equation $$C(t) = S(t) + P\sin(\omega_p t) + D(t)\sin(2\omega_p t) \qquad (1)$$

where S(t) and D(t) correspond to the time varying (L+R) and (L−R) signals respectively, P is the amplitude of the pilot signal and $\omega_p$ is the radian frequency of the pilot signal. The synthesized pilot signal applied to subtraction circuit 112 is developed by measuring the amplitude of the residual pilot signal at the output of subtraction circuit 112, effectively amplifying the residual amplitude, and multiplying this value by the output of the frequency divider 126. Assume that the amplitude $P_c$ of the synthesized pilot exactly equals the pilot amplitude P. The synthesized $'_p t$)pilot signal can thus be represented as $P_c \sin(\omega'_p t)$. The output C(t)' from subtraction circuit 112 may be expressed $$C'(t) = S(t) + P\sin(\omega_p t) - P_c\sin(\omega'_p t) + D(t)\sin(2\omega_p t). \qquad (2)$$

The signal C'(t) is multiplied in multiplier 120 by $\cos(\omega'_p t)$ to yield $$C'(t)\cos(\omega'_p t) = S(t)\cos(\omega'_p t) + P\sin(\omega_p t)\cos(\omega'_p t) - \qquad (3)$$
$$P_c \sin(\omega'_p t)\cos(\omega'_p t) + D(t)\sin(2\omega_p t)\cos(\omega'_p t).$$

The first and last terms in equation (3) are sinusoids which will average to zero in the low-pass filter 122. The center two terms $P\sin(\omega_p t)\cos(\omega'_p t) - P_c\sin(\omega'_p t)\cos(\omega'_p t)$ may be shown, by manipulating trigonometric identities, to be equivalent to $$P/2(\sin(\omega_p t - \omega'_p t) + \sin(\omega_p t + \omega'_p t) - \sin(2\omega'_p t)). \qquad (4)$$

The two rightmost terms are relatively high frequency sinusoids and will average to zero in the low-pass filter 122. Since the nominal output frequency of the VCO 124 is established close to $\omega_p$, the argument $(\omega_p t - \omega'_p t)$ of the first term of expression (4) will be close to zero. The term $\sin(\omega_p t - \omega'_p t)$ will be a very low frequency sinusoid and will not average to zero unless $\omega'_p$ equals $\omega_p$. Therefore, as long as the frequency $\omega'_p$ is different from the pilot frequency, multiplier 120 and low-pass filter 122 will generate a correction signal for application to the VCO 124.

Next, consider that $\omega'_p$ and $\omega_p$ are identical frequencies but out of phase by $\alpha$ degrees. In this instance, the output of multiplier 120 takes the form $$C'(t)\cos(\omega_p t + \Delta) = S(t)\cos(\omega'_p + \Delta) + \qquad (5)$$
$$P\sin(\omega_p t)\cos(\omega_p t + \Delta) - P_c\sin(\omega_p t + \Delta)\cos(\omega_p t + \Delta) + D(t)\sin(2\omega_p t)\cos(\omega_p t + \Delta).$$

The first and fourth terms on the right hand side of equation will average to zero in low-pass filter 122 since they represent sinusoidal signals having frequencies relatively high compared to the reciprocal time constant of the filter. The two middle terms can be shown to be equivalent to $$P/2(\sin(2\omega_p t + \Delta) + \sin\Delta - (2\omega_p t + 2\Delta). \qquad (6)$$

The first and third terms are relatively high frequency sinusoidal signals and will average to zero in low-pass filter 122. The remaining term, $P/2\sin\Delta$, is substantially a dc term and, thus, will be passed by the low-pass filter 122 and provide a phase correction term to VCO 124 even when the VCO frequency is exactly correct. Thus, as long as a frequency or phase error exists, multiplier 120 and low-pass filter 122 provide a correction signal to the VCO 124. If no error exists, no error signal is generated, and none is needed.

The composite signal, less the pilot signal, from subtraction circuit 112 is coupled to respective multiplicand input terminals of multipliers 116 and 130. The signal $\sin(2\omega_p t)$ from VCO 124 is applied to the multiplier input terminal of multiplier 116 to produce the signal (L−R)' described by the equation $$(L - R)' = S(t)\sin(2\omega_p t) + D(t)\sin(2\omega_p t)\sin(2\omega_p t) \qquad (7)$$
$$= S(t)\sin(2\omega_p t) + D(t)(1 - \cos^2(2\omega_p t)) \qquad (8)$$

which is applied to the low-pass filter 118. Low-pass filter 118 is designed to pass only the baseband term D(t) which corresponds to the (L−R) signal.

The output from subtraction circuit 112 is multiplied by the signal $\sin(\omega_p t)$ in multiplier 130. The output, $P_o$, of multiplier 130 may be expressed $$P_o = S(t)\sin(\omega_p t) + P\sin(\omega_p t)\sin(\omega_p t) - P_c\sin(\omega_p t)\sin(\omega_p t) + D(t)\sin(2\omega_p t)\sin(\omega_p t) \qquad (9)$$

where $P_c\sin(\omega_p t)\sin(\omega_p t)$ corresponds to the pilot cancelling signal. The signal $P_o$ is applied to the low-pass filter 132 which integrates the signal over a relatively long period compared to $2\pi/\omega_p$. The first and fourth terms on the right-hand side of equation (9) average to zero. The middle two terms may be represented $$(P - P_c)\sin^2(2\omega_p t) = (P - P_c)(1 - \cos^2(2\omega_p t)) \qquad (10)$$

The term $(P - P_c)\cos^2(2\omega_p t)$ averages to zero in the filter 132 leaving only the dc difference term (P−Pc) which is the amplitude of the residual pilot signal. Low-pass filter 132 has a DC gain of A. The signal applied to multiplier 134 is therefore $A(P - P_c)$ This value is multiplied by the $\sin(\omega_p t)$ from divider 126 to generate the synthesized pilot signal. The ratio of the residual pilot signal to the pilot signal converges to the value $1/(1+A)$. Thus, if A is made very large, the value of $(P - P_c)$ becomes substantially zero.

In order to describe the specific serial-bit digital embodiment of the invention, a method for multiplying sampled data signals will be discussed with reference to FIG. 2.

Figure 2:
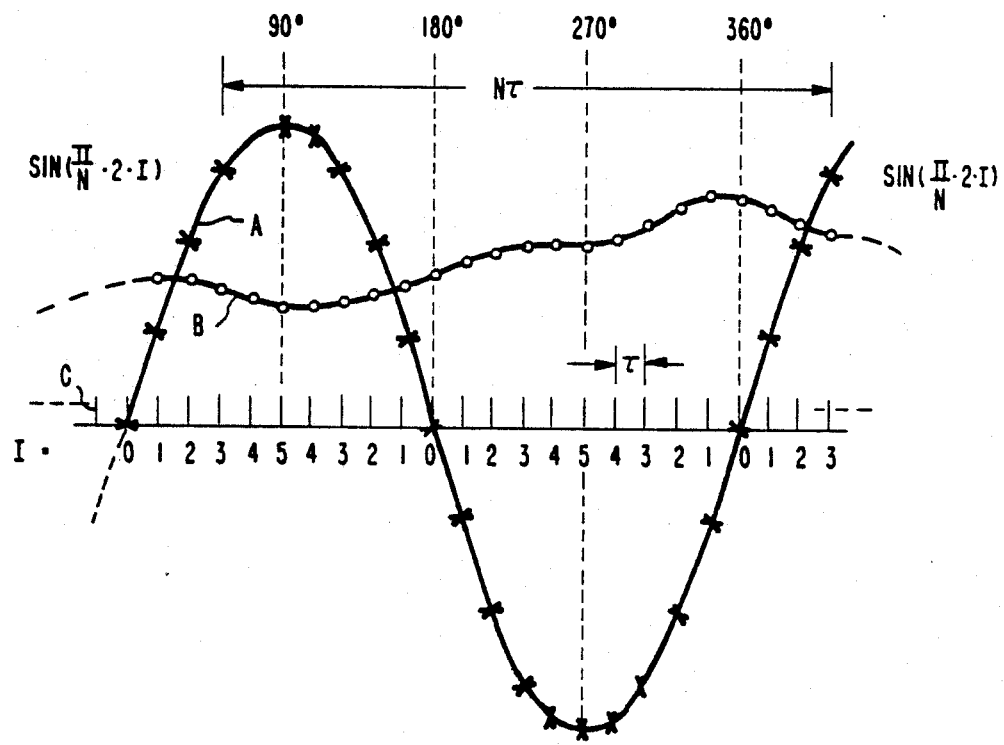
FIGS. 2 and 4 are waveform drawings useful in describing specific embodiments of the invention.

FIG. 2 illustrates an arbitrary signal (waveform B) which is to be multiplied by a sinusoid (waveform A). The waveforms are illustrated in analog form for convenience but the multiplication is to be performed digitally. Waveform C represents a sample rate clock with the tic marks representing points in time at which the analog signals are represented by corresponding discrete samples. The x's and zeroes on waveforms A and B respectively represent the amplitudes of the pulse cod modulated (PCM) digital samples.

The sinusoid A has a constant amplitude and is assumed to be phase locked to the sample clock. The period of sinusoid A is N times the period of the sample clock C. Therefore, the values of every Nth sample of the sinusoid are the same. Consequently every Nth sample of the waveform B will be multiplied by the same value. The samples represented by waveform B are multiplied (scaled) by a maximum of N values representing the sinusoid. The two half cycles of the sinusoid are symmetric in that the magnitudes of the corresponding consecutive values representing the two half cycles are the same. Thus, the number of scale factors required to represent the sinusoid is actually N/2 if provision is made to effect a change of polarity. Further, if the number N is even, there is symmetry about quarter cycles of the sinusoid, further reducing the number of magnitude values required to represent the sinusoid to (N/4+1) values.

In FIG. 2, N is equal to 20. The values of the magnitudes of the scale factors required to represent the sinusoid may be represented by the expression sin $(2I\pi/N)$ where I is an index equal to 0, 1, 2 ... N/4. For N equal to 20, the index I goes from zero to 5.

Multiplication of waveform B by a sinusoid as represented by waveform A is performed as follows. The PCM signal represented by waveform B is applied to N/4+1 scaling circuits which respectively scale the samples by $\sin((2I\pi/N)$, I=0 to 5. The scaled PCM samples are multiplexed at the sample rate according to the sequence of index values 0, 1, 2, 3, 4, 5, 4, 3, 2, 1, 0, 1, 2, etc. The output of the multiplexer is applied to circuitry for selectively inverting the polarity of applied signals. Alternate sets of ten consecutive scaled samples between the zero valued indicies have their polarities reversed.

Alternatively, if it is desired to multiply by a cosinusoidal signal the scaled samples are multiplexed according to the sequence of index values 5, 4, 3, 2, 1, 0, 1, 2, 3, 4, 5, 4, 3, 2, 1, 0, 1, 2, 3, 4 and alternate sets of ten consecutive scaled samples between index values of zero have their polarities reversed.

It should be appreciated that the technique set forth provides multiplication of an arbitrary PCM signal by a sinusoidal signal without the necessity of actually providing a sinusoidal signal.

Figure 3:
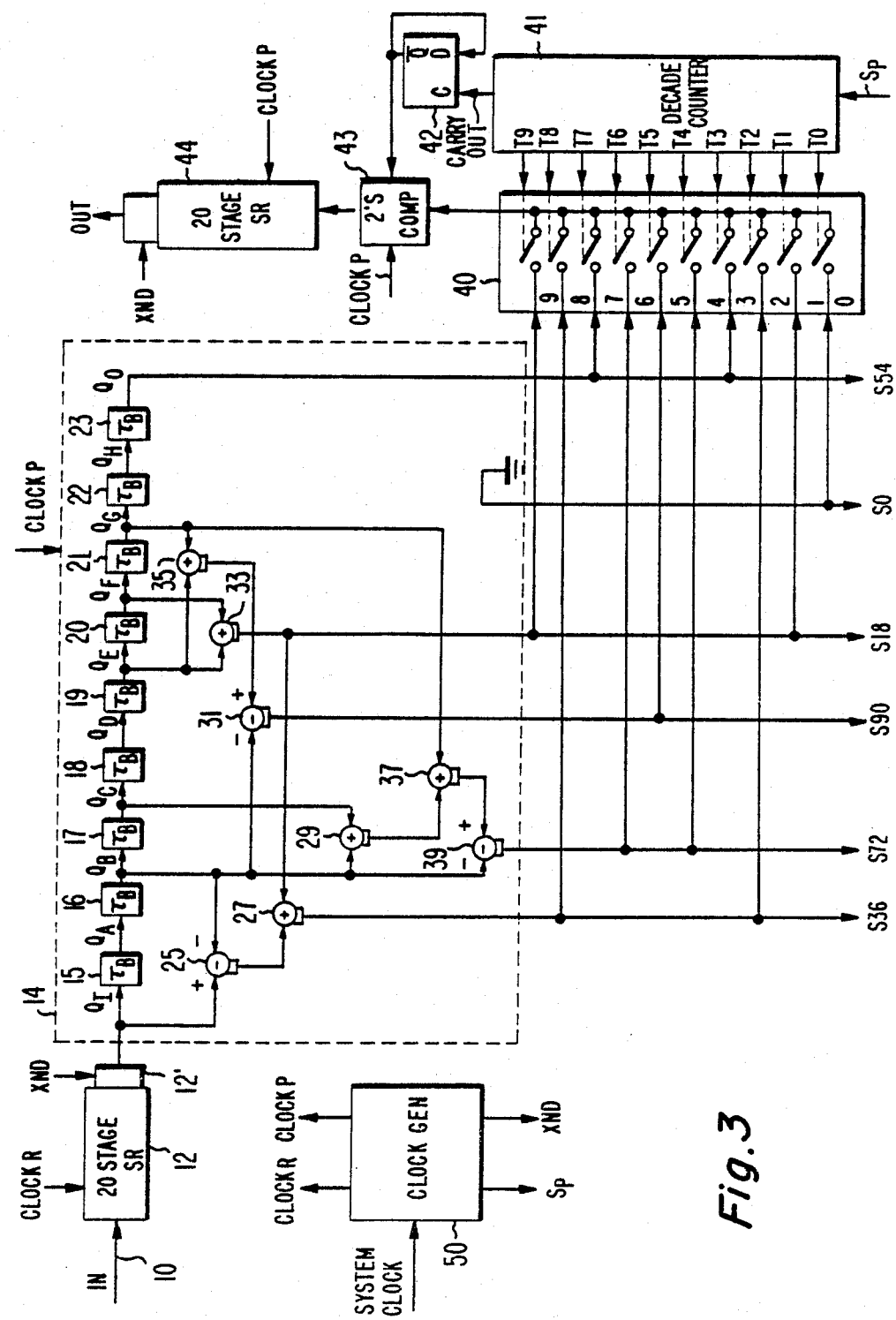
FIG. 3 is a block diagram of serial-bit digital signal multiplying apparatus useful for demodulating amplitude modulated signals.

FIG. 3 illustrates exemplary circuitry for multiplying a serial-bit PCM signal by a sinusoidal signal having a period N=20 times the period of the sample rate of the PCM signal. The input samples are assumed to be 20-bit samples in two's complement format with the least significant bit (LSB) of respective samples occurring first in time and the most significant bit (MSB) being a sign bit. In order to avoid using true multiplier circuits, a system of bit-shifting-and-adding is employed to scale samples. Those persons skilled in the art of serial-bit digital processing will appreciate that advancing or delaying a serial-bit signal respectively effects a division or multiplication of the sample by $2^n$ where n is the number of bit positions the sample is advanced or delayed relative to the applied sample. Scaling is performed by providing relatively advanced and delayed replicas of the sample and summing and/or differencing the appropriate sample and advanced/delayed replicas to produce the desired scaled sample.

Figure 4:
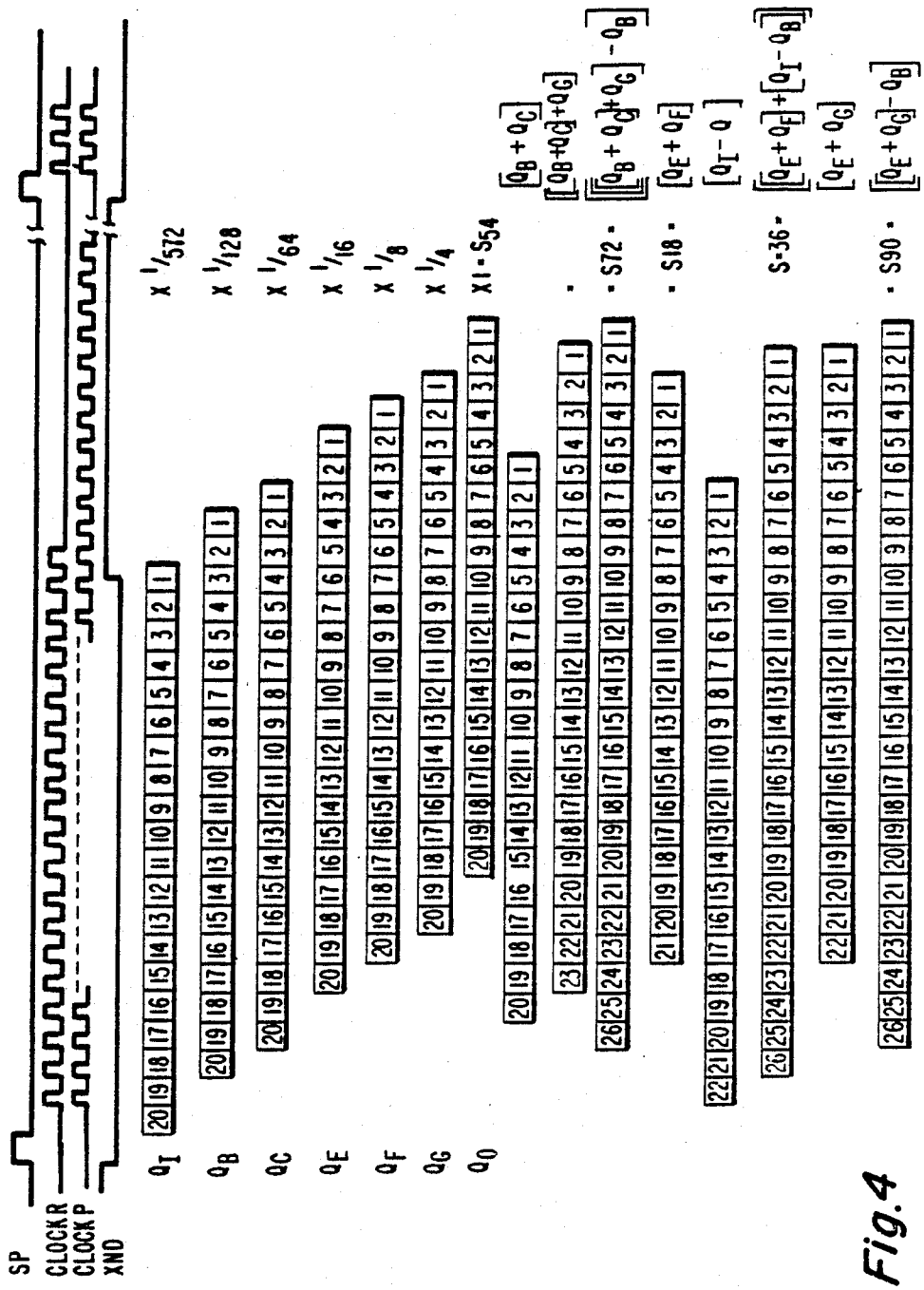

The FIG. 3 apparatus will be described with reference to the waveforms and bit-patterns illustrated in FIG. 4. In FIG. 3 the samples to be multiplied by a sinusoid are applied at connection 10 to the 20-stage serial-bit register 12. At the beginning of each sample period defined by the sample pulse $S_p$, the register 12 contains a 20-bit sample. Register 12 is clocked by clock R, which provides 20 clock pulses per sample period, to output the sample, LSB first and MSB last, to scaling circuit 14. Register 12 includes an output latch 12' which is controlled by the signal XND to latch and replicate the MSB (sign-bit) for the duration of the sample period.

Scaling circuit 14 includes cascaded delay stages 15–23 which are clocked synchronously at the sample bit rate and each of which provide a one sample bit delay period. The serial sample bit stream from register 12 is coupled to the delay stages 15–23 each of which provides a sample replica successively delayed by one bit period. In this embodiment the delayed replica, represented by $Q_o$, provided by delay stage 23, is utilized as the reference sample or sample datum. $Q_o$, utilized as the reference sample, is effectively scaled by the factor "1", and the remaining scaled samples are referenced to this sample. Selecting $Q_o$ as the reference provides two advantages. The first is that there are nine available replicas advanced in time by consecutive bit periods relative to $Q_o$. These replicas are representations of the sample at $Q_o$ scaled by the values $\frac{1}{2}$, $\frac{1}{4}$, $\frac{1}{8}$, 1/16, 1/32, 1/64, 1/128, 1/256 and 1/512. Secondly, it facilitates generating scale factors which are relatively close approximations to $\sin(2I\pi/N)$ for N=20 with a minimum of add/subtract circuits.

For N even and equal to 20, the scale factors are symmetric about 90 degrees. The magnitudes of the scale factors correspond to the sines of the arguments of 0°, 18°, 36°, 54°, 72° and 90°. It has been found that by normalizing the scale factors to sin 54°, very simple sums of binary submultiples closely approximate the actual trigonometric ratios. In other words, rather than establishing the scale factors as the values of sin(-$2I\pi/N$), the scale factors have been established according to $\sin(2I\pi/N)/\sin(54°)$. This expands the normal range of 0 to 1 for the scale factors representing the sines of 0° to 90°, to scale factors having the range of 0 to 1.2361. If it is of consequence to the operation of the system in which the multiplier apparatus of FIG. 3 is implemented, the output samples from the multiplier can be subsequently normalized to samples multiplied by a unit sinusoid by scaling the output samples by the magnitude of sin (54°) or 0.8090 decimal. Table I lists the indicies I, the argument $\theta = (2I\pi/N)$ the normalized scale factors sin $\theta$/sin 54, the binary estimate of the scale factors developed by scaling circuit 14 and the percent error between the binary estimates and the actual scale factor.

TABLE I

| I | θ | sin θ/sin 54 | binary estimate | % error |
|---|---|---|---|---|
| 0 | 0 | 0 | 0 | 0.00 |
| 1 | 18 | 0.3820 | 0.3750 | 2.07 |
| 2 | 36 | 0.7265 | 0.7266 | 0.01 |
| 3 | 54 | 1.0000 | 1.0000 | 0.00 |
| 4 | 72 | 1.1756 | 1.1718 | 0.32 |
| 5 | 90 | 1.2361 | 1.2343 | 0.15 |

Referring again to FIGS. 3 and 4, the bit pattern output from register 12 is illustrated as $Q_I$ and is coincident in time with the burst of bit-rate pulses of clock R. The sample represented by $Q_I$ is delayed nine bit-periods by delay elements 15–23 and is output from delay element 23 as the delayed replica $Q_o$. In addition, replicas of $Q_I$ delayed by 2, 3, 5, 6 and 7 bit periods from delay elements 16, 17, 19, 20 and 21 are represented $Q_B$, $Q_C$, $Q_E$, $Q_F$ and $Q_G$ respectively. Since $Q_o$ has been specified as the reference sample, samples $Q_G$, $Q_F$, $Q_E$, $Q_C$, $Q_B$ and $Q_I$ all occur advanced in time relative to $Q_o$. Thus, at any instant in time the samples $Q_G$, $Q_F$, $Q_E$, $Q_C$, $Q_B$ and $Q_I$ correspond to sample $Q_o$ divided by 4, 8, 16, 64 128 and 512 respectively. In FIG. 4, for a given sample period, all of the bit pattern values (ones and zeroes) of samples $Q_I$ to $Q_o$ are the same but relatively displaced in time. The sums of samples illustrated below the samples $Q_I$ to $Q_o$, however, contain different values and different numbers of bits. The numbers in the bit patterns of the sums, therefore, only serve to indicate the number of bits in the respective sums.

The normalized scaled samples are derived as follows. The scale factor, $S_o$, corresponding to 0° is zero and the scaled samples corresponding to $S_o$ are logic zero potential. The scale factor, $S_{54}$ corresponding to 54° to which all the scale factors are normalized is one. The scaled sample corresponding to $S_{54}$ is obtained by selecting the sample $Q_o$ as it occurs from delay element 21. The desired scale factor, Sl8, corresponding to the normalized sine of 18° is 0.3820. The scaled sample Sl8 is S approximated by combining the sample $Q_E$ which corresponds to 1/16 the reference sample value, with the sample $Q_F$ which corresponds to ⅛ the reference sample value in adder circuitry 33. Adder circuit 33 (and the remaining adder and subtracter circuits illustrated in FIG. 2) requires one bit period to perform the addition. The contributions to the sum are therefore effectively multiplied by a factor of two relative to the sample datum. Adder 33 produces the value $2(Q_E+Q_F)$ which corresponds to 2/16 times the current sample value plus 2/8 times the current sample value or 0.3750 times the current sample value. Note, in FIG. 4 each set of square brackets about a sum designates that the sum has been delayed in its generation by one bit period, consequently, each square bracket indicates that the bracketed sum is to be multiplied by two for each bracket.

The normalized scale factor for the normalized sine of 36° ($S_{36}$) from Table I, is 0.7265. The scaled sample $S_{36}$ is approximated by adding the sum provided by adder 33 to the difference $2(Q_I-Q_B)$ and multiplying this sum by the factor two. Sample $Q_B$ is subtracted from sample $Q_I$ in subtracter 25. This difference is multiplied by two by virtue of the one bit delay of the subtracter. The difference from subtracter 25 and the sum from adder 33 are summed in adder 27 which also inherently provides a multiplication by two. The value output by adder 27 corresponds to $$S_{36} = 2[2[Q_I - Q_B] + 2[Q_E + Q_F]] \quad (11)$$

$$= 2[2[1/512 - 1/128] + 2[1/16 - \tfrac{1}{8}]] \times \text{current sample}$$

$$= 0.7266 \times \text{current sample}.$$

The scale factor, $S_{72}$, corresponds to the normalized sine of 72°. The scaled sample $S_{72}$ is formed by adding $Q_B$ and $Q_C$ in adder 29, adding this sum to $Q_G$ in adder 37 and then subtracting $Q_B$ from the total sum in subtracter 39. The inherent delays in the three level adder/subtracter tree result in $$S_{72} = 2[2[2[Q_B + Q_C] + Q_G] - Q_B] \quad (12)$$

-continued
$$= 2[2[2[1/128 + 1/64] + \tfrac{1}{8}] - 1/128] \times \text{current sample}$$

$$= 1.1718 \times \text{current sample}.$$

The normalized scaled samples $S_{90}$ corresponding to the input samples multiplied by the sine of 90° are formed by adding the samples $Q_E$ and $Q_G$ and then subtracting the sample $Q_B$ from this sum.

$$S_{90} = 2[2[Q_E + Q_G] - Q_B] \quad (13)$$

$$= 2[2[1/16 + \tfrac{1}{8}] - 1/128] \times \text{current sample}$$

$$= 1.2343 \times \text{current sample}.$$

The scaled output samples $S_0$, $S_{18}$, $S_{36}$, $S_{54}$, $S_{72}$, $S_{90}$ from scaling circuit 14 are coupled to respective input connections of 10-to-1 multiplexer 40. Output $S_0$ is coupled to multiplexer switch 0. Output $S_{18}$ is coupled to multiplexer switches 1 and 9. Output $S_{36}$ is coupled to multiplexer switches 2 and 8. Output $S_{54}$ is coupled to multiplexer switch 3 and 7. Output $S_{72}$ is coupled to multiplexer switches 4 and 6, and output $S_{90}$ is coupled to multiplexer switch 5.

The switches of multiplexer 40 are selectively controlled by the decade counter 41, which is clocked at the sample rate by signal $S_p$, to successively couple the scaled sample values to the two's complement circuitry 43. One scaled sample is coupled to circuitry 43 per sample period. To effect a multiplication by a sinusoid the decade counter is arranged to sequentially exclusively close switches 0–9 in ascending order and successively repeat this operation. The output of multiplexer 40, for each sequence of 0–9 switch closures, corresponds to the applied PCM samples multiplied by the positive half of a sine wave, since all of the scaling circuits produce positive valued scale factors. A two's complement circuit 43 is coupled to the output connection of multiplexer 40 to perform a polarity reversal on alternate half cycles of the sinusoidally scaled samples. That is for alternate sequences of switch closures 0–9, two's complement circuit 43 is conditioned to pass samples coupled to its input connection, unaltered. During intervening sequences of switch closures 0–9, the two's complement circuit 43 is conditioned to complement or reverse the polarity of the samples coupled to its input. If the decade counter 41 is realized with a type CD4017 decade counter available from RCA Corporation, Somerville, N.J., the two's complement circuitry may be controlled by the carry-out signal from the counter. The carry-out signal has a positive going transition coincident with the first of the count output signals $T_0$–$T_9$. The carry-out is applied to a positive edge triggered flip-flop 42 arranged as a divide-by-two frequency divider. Flip-flop 42 so arranged produces a logic high level for alternate series of counter output signals $T_0$–$T_9$ and a logic low level for intervening series of counter output signals $T_0$–$T_9$ as required to effect the desired polarity reversal.

In the system illustrated, it is assumed that the two's complement circuitry includes a two-bit-period delay. There is, therefore, a total bit delay for the MSB from register 12 to the output of the two's complement circuit 43 of 31 bit rate clock periods. In addition, different ones of the scaled samples have different numbers of bits. In order to normalize the scaled samples, that is to properly justify them in bit-size and time, the samples from two's complement circuitry 43 are applied to a 20 stage register 44. Register 44, two's complement circuitry 43 and scaling circuit 14 are all clocked with a bit-rate clock having bursts of 31 pulses per sample period and designated as clock P in FIGS. 3 and 4. Clocking the scaled samples, which have undergone fewer delays than the datum samples $Q_0$, into register 44 with clock P, establishes the position of the bits of these samples relative to the datum to maintain the effect of scaling. In this process excess lesser significant bits of the scaled samples are dropped off the end of register 44.

Clock generator 50 provides the requisite clock and control signals from a system clock. The clock signals may easily be generated from the waveforms of FIG. 4 by one skilled in the art of signal processing so element 50 will not be described in detail.

The system of FIG. 3 may be arranged to multiply the input signal by a cosinusoidal waveform by rearranging the multiplexer connections to multiplex the scaled samples in the order $S_{90}$, $S_{72}$, $S_{54}$, $S_{36}$, $S_{18}$, $S_0$, $S_{18}$, $S_{36}$, $S_{54}$, $S_{72}$, $S_{90}$, $S_{72}$, $S_{54}$, $S_{36}$, $S_{18}$, $S_0$, $S_{18}$, $S_{36}$, $S_{54}$, $S_{72}$, $S_{90}$, etc. and complementing the scaled samples between alternate occurrences of scaled samples $S_0$ Further, if the accuracy of the LSB of the output signal from the polarity reversing circuitry 43 is not critical, polarity reversal may be performed by a 1's complement circuit consisting of an exclusive OR gate with one input terminal coupled to the output of multiplexer 40 and a second input coupled to the flip-flop 42.

Figure 5:
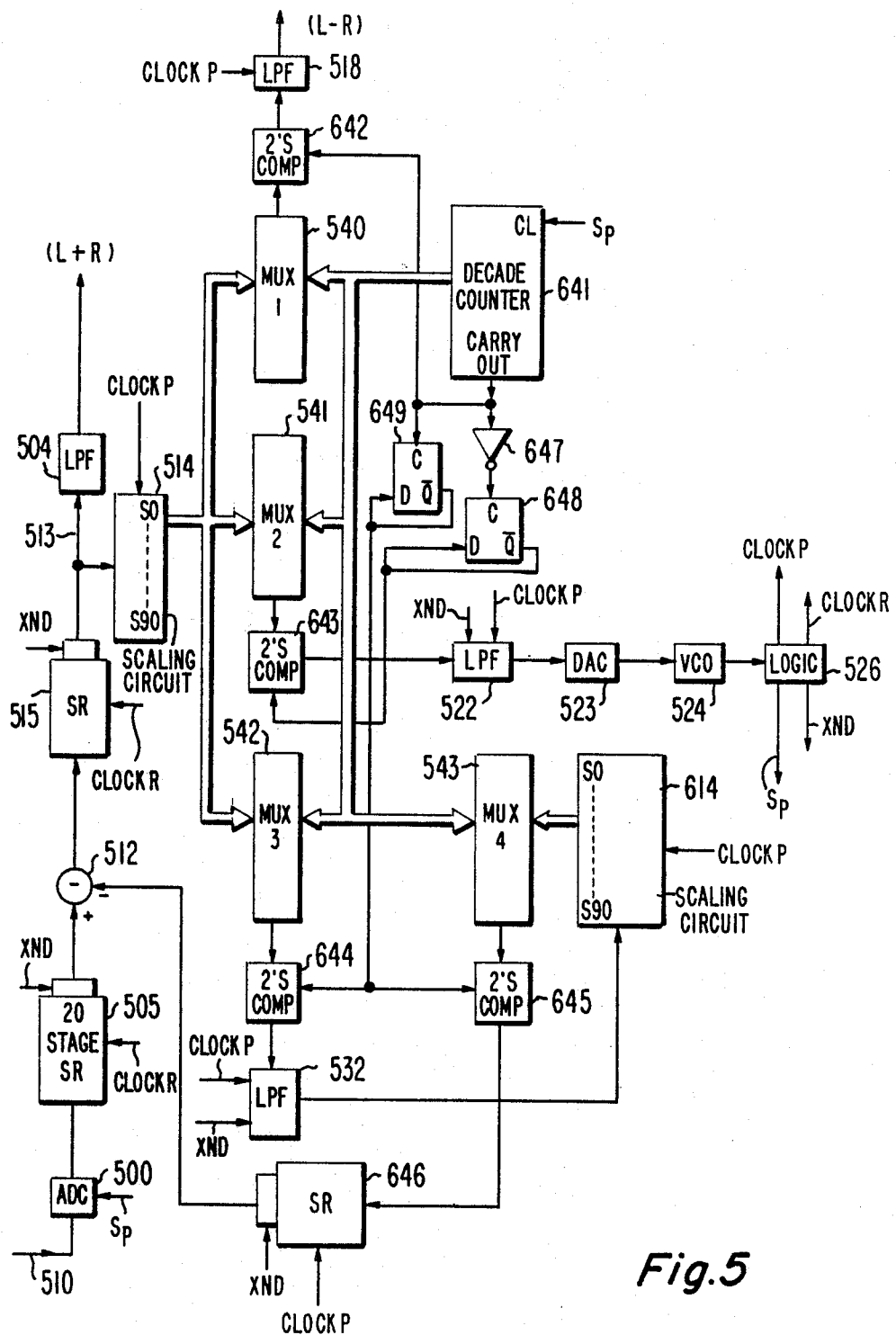
FIG. 5 is a block diagram of a serial-bit sampled data system for cancelling the pilot signal from a composite signal and including apparatus for separating the component signals of the composite signal.

FIG. 5 illustrates serial-bit digital signal processing apparatus for processing composite signals. For illustrative purposes the clock and control signals referred to in FIG. 5 are assumed to conform to the clock and control signals described in FIGS. 3 and 4. Analog baseband composite signal is applied from connection 510 to the analog signal input terminal of an analog-to-digital converter, ADC, 500. A sample clock signal, $S_p$, developed by VCO 524 and logic circuitry 562 and phase locked to the pilot signal, is coupled to the sample clock input terminal of ADC 500 which develops, for example, 20-bit serial PCM samples representing the input signal. The 20-bit serial-bit samples developed by ADC 500 are clocked into a 20-stage shift register 505 by clock R, which is also developed by logic circuitry 526. Register 505 includes a sign extend latch controlled by the control signal XND. The samples stored in register 505 are coupled to one input of the serial bit subtracter 512. A synthesized serial-bit pilot signal is coupled to a second input of subtracter 512 which produces output samples corresponding to the composite input signal with its pilot signal component substantially cancelled. The output samples from subtracter 512 are applied to the input of the register 515 having P-r stages where P is the number of pulses in a burst of pulses from clock P and r is the number of sample bit delay periods incurred by the samples in subtracter 512. Register 515 is clocked by clock P, and includes a sign extend latch which replicates the 20th or sign bit of the samples output by the register, from the 20th clock pulse period to the end of the sample period.

The samples from register 515 are coupled to the serial-bit low-pass filter 504 which passes serial bit samples representing the (L+R) component of the composite input signal, to the substantial exclusion of the residual pilot signal and the difference signal. An example of a serial-bit low-pass filter is described in the article "Compact NMOS Building Blocks and a Methodology for Dedicated Digital Filter Applications", Van Ginderdeuren et al., IEEE, JSSC, Vol. SC-18, No. 3, June 1983, pp. 306–315.

Output samples from register 515 are also coupled to the input terminal of the scaling circuitry 514 which may be similar to scaling circuitry 14 in FIG. 3. Scaled output samples from scaling circuitry 514 are coupled to the signal input terminals of multiplexers 540, 541 and 542, each of which may be similar to multiplexer 40 in FIG. 3. The multiplexers 540–542 have respective switches 0–9 which are respectively controlled by signals $T_0$–$T_9$ provided by the decade counter 641. Decade counter 641, which may be similar to the decade counter 41 of FIG. 3, is clocked through its respective states by the sample clock $S_p$ provided by logic circuitry 526. The sequences in which the respective multiplexers order the scaled samples $S_0$–$S_{90}$ from the respective scaling circuits 514 and 614 are shown in Table II.

TABLE II

|  | $T_0$ | $T_1$ | $T_2$ | $T_3$ | $T_4$ | $T_5$ | $T_6$ | $T_7$ | $T_8$ | $T_9$ |
|---|---|---|---|---|---|---|---|---|---|---|
| MUX 540 | $S_0$ | $S_{36}$ | $S_{72}$ | $S_{72}$ | $S_{36}$ | $S_0$ | $S_{36}$ | $S_{72}$ | $S_{72}$ | $S_{36}$ |
| MUX 541 | $S_{90}$ | $S_{72}$ | $S_{54}$ | $S_{36}$ | $S_{18}$ | $S_0$ | $S_{18}$ | $S_{36}$ | $S_{54}$ | $S_{72}$ |
| MUX 542 | $S_0$ | $S_{18}$ | $S_{36}$ | $S_{54}$ | $S_{72}$ | $S_{90}$ | $S_{72}$ | $S_{54}$ | $S_{36}$ | $S_{18}$ |
| MUX 543 | $S_0$ | $S_{18}$ | $S_{36}$ | $S_{54}$ | $S_{72}$ | $S_{90}$ | $S_{72}$ | $S_{54}$ | $S_{36}$ | $S_{18}$ |

Multiplexers 542 and 543 sequence the scaled samples in the same order as multiplexer 40 in FIG. 3 and, therefore, develop output signals corresponding to the signal coupled to the scaling circuit multiplied by a sinusoidal signal. Multiplexer 541 generates a sequence similar to the sequences produced by multiplexers 542 and 543 but advanced in time by 90 degrees. The sequence of scaled samples generated by multiplexer 541 represents the input signal multiplied by a cosinusoidal signal.

Multiplexer 540 generates a sequence of the alternate scaled samples which is repeated twice during one set of $T_0$–$T_9$ switching signals. The first sample of the sequence corresponds to $S_0$, hence the output of multiplexer 540 corresponds to the product of a sinusoid of twice the frequency of the sinusoidal products provided by multiplexers 541–543.

The output terminals of the multiplexers 540–543 are coupled to polarity reversing circuits 642–645 respectively. The polarity reversing circuits are controlled by the carry-out signal from the decade counter 641. The carry-out signal from the decade counter 641 is a square wave having positive and negative going transitions coincident with the leading transitions of switching pulses $T_0$ and $T_5$. This square wave is coupled directly to the polarity reversing circuit 642, to invert the scaled samples which are output by the multiplexer 540 during the occurrence of switching pulses $T_5$–$T_9$, to produce one full cycle of the sine wave for one cycle of $T_0$–$T_9$ switching pulses.

The sequence developed by multiplexer 541 is required to go through the value zero at each occurrence of the switching pulse $T_5$, to effect multiplication by a cosine. The sequence output by multiplexer 541 is inverted during alternate occurrences of the set of switching pulses $T_5$–$T_4$. Therefore, polarity reversing circuit 643 is controlled by a square wave having twice the period of the carry-out signal from decade counter 641. This square wave is generated by applying the carry-out signal to the inverter 647 to produce a square wave having a positive going transition at switching pulse $T_5$. The output of inverter 647 is coupled to the clock input of a positive edge triggered D type flip-flop, 648, connected as a frequency divide-by-two circuit. Flip-flop 648 generates a square wave having alternate logic "1" and logic "0" states for alternate sequences of switching pulses between subsequent occurrences of switching pulse $T_5$. The output of flip-flop 648 is coupled to control the polarity reversing circuit 643.

Multiplexers 542 and 543 are arranged to generate the product of the applied signal times a sinusoid. In this instance, the multiplexed output signals are reversed in polarity for the periods between alternate occurrences of the switching signal $T_0$. The control signal to control the polarity reversing circuits 644 and 645 is generated by the flip-flop 649 connected as a divide-by-two circuit responsive to the carry-out signal from decode counter 641.

The output signal from polarity reversing circuit 642 is a serial-bit PCM counterpart of the output signal from multiplier 116 in FIG. 1. This signal is applied to the serial bit low-pass filter 518 which passes the (L−R) signal D(t) to the substantial exclusion of other signal components.

The output signal from polarity reversing circuit 643 is a serial-bit PCM counterpart to the signal output from multiplier 120 in FIG. 1. The output from circuit 643 is applied to the low-pass filter 522 which may include a serial-bit input register to effect sample bit justification. Low-pass filter 522 may also include a scaling circuit to normalize the 1/sin54 factor incurred in the multiplier.

The low-pass filtered signal is converted to analog form in the digital-to-analog converter (DAC) 523 which is applied to the control input of the VCO 524. VCO 524 generates a signal phase locked to the pilot signal having a frequency which is at least twenty times the frequency of the pilot signal. The output signal produced by the VCO 524 is coupled to the logic circuitry 526, which may include counter circuits, and which develops the control signal XND, sampling signal Sp, and the clock signals CLOCK R and CLOCK P.

It should be appreciated that the signal output from polarity reversing circuit 643 may be converted to analog form prior to low-pass filtering and that the gain factor sin 54° and any additional desired gain may be included in either the low-pass filter 522, DAC 523, or VCO 524.

The output signal from polarity reversing circuit 644, which is the serial-bit counterpart to the output signal from multiplier 130 in FIG. 1, is coupled to the low-pass filter 532. Low-pass filter 532 has a relatively narrow bandwidth about zero Hertz and produces an output signal corresponding to the average amplitude of G times the difference between the pilot signal and the synthesized pilot signal (G=1/sin 54° ). The output of filter 532 is coupled to the scaling circuitry 614 which may be identical to scaling circuitry 514. Scaling circuit 614 has output terminals $S_0$, $S_{18}$...$S_{90}$ from which scaled values of the pilot difference amplitude are available. The $S_0$–$S_{90}$ output terminals are coupled to the multiplexer 543 which generates the sequence of scaled values indicated in Table II.

The output signal from the cascade connection of multiplexer 543 and polarity reversing circuit 645 is a serial-bit PCM counterpart of the output signal from the multiplier 134 of FIG. 1. This signal is coupled to the subtrahend input of subtraction circuit 512 via the shift register 646 which is interposed to properly justify the signal samples. Register 646 includes a sign extend latch for replicating the sign bit of each sample for the duration of the sample period following the occurrence of the sign bit.

The phase of the synthesized pilot signal produced from multiplexer 543 and polarity reversing circuit 645 is shifted by $2\pi/20$ radians relative to the actual pilot signal because of the interposition of register 515 between subtracter 512 and the scaling circuit 514. In order for the synthesized pilot signal coupled to subtracter 512 to be in phase with the pilot signal included in the composite signal coupled to subtracter 512, register 646 must provide a delay of 19 sample periods. Alternatively, the order of multiplexing the scaled samples $S_0$–$S_{90}$ from scaling circuit 614 may be shifted to advance the synthesized pilot signal by $4\pi/20$ radians and register 646 may provide a single sample period delay. In a further alternative, register 646 may be arranged to provide a delay of sufficient sample periods so that the synthesized and actual pilot signals coupled to element 512 are antiphase in which case an adder may be substituted for subtracter 512 to provide pilot signal cancellation.

In order to substantially cancel the pilot signal, the loop including subtraction circuit 512, scaling circuit 514, multiplexer 542, low-pass filter 532, scaling circuit 614, multiplexer 543 and shift register 646 must include some DC gain. The two scaling circuits 514 and 614 each contribute a gain of G=1/sin 54. Additional gain may be provided in the low-pass filter 532, by shifting the bit significance of its output signal. Alternatively, the gain and low-pass filter functions may be accomplished by performing low-pass filtering with a leaky integration circuit. The transfer function of the loop related to the pilot signal, between the input and output of the subtraction circuit 512 may be expressed as $1/(1+AG^2)$ which is equivalent to the pilot signal attenuation factor. The factor A is the DC gain attributed to the low-pass filter 532 and is selected to provide the desired degree of pilot signal cancellation.

The arrangement of FIG. 5 is advantageous in that only one counter (641), four multiplexers, and two scaling circuits are required to develop the four products of two signals and respective sinusoidal signals.

What is claimed is:

1. Apparatus, for processing a composite signal including a pilot signal, comprising:
    a signal input terminal for applying said composite signal;
    signal combining means having a first input terminal coupled to said signal input terminal, having a second input terminal and an output terminal for providing a combined signal;
    means including a phase-locked-loop having an input coupled to the output terminal of said signal combining means, for generating a synthesized pilot signal responsive to residual pilot signal output from said signal combining means; and
    means for coupling said synthesized pilot signal to the second input of said signal combining means in a sense to cancel the pilot signal included in said composite signal.

2. Apparatus, for processing a composite signal including a pilot signal, comprising:
    a signal input terminal for applying said composite signal;
    signal combining means having a first input terminal coupled to said signal input terminal, having a second input terminal and an output terminal;

first and second multiplier circuits having respective first input terminals coupled to the output terminal of the combining means, having respective second input terminals and respective output terminals;

low-pass filter means coupled to the output terminal of said first multiplier circuit;

controlled oscillator means having a control input coupled to said low-pass filter means, for generating first and second signals in phase with said pilot signal and in quadrature phase with said pilot signal respectively;

means for coupling said quadrature phase signal to the second input terminal of said first multiplier circuit;

means for coupling the in-phase signal to the second input terminal of said second multiplier circuit;

a third multiplier circuit having a first input terminal coupled to receive said in-phase signal, having an output terminal at which a synthesized pilot signal is available and having a second input terminal;

further low-pass filter means coupled between the output terminal of said second multiplier circuit and the second input terminal of said third multiplier circuit; and means for coupling said synthesized pilot signal to the second input of said signal combining means in a sense to cancel the pilot signal included in said composite signal.

3. A sampled data system for processing a composite signal including a pilot signal of frequency F, comprising:

a signal input terminal for applying said composite signal;

sampling means, having an input coupled to said signal input terminal, having a sampling input terminal for applying a sampling signal of frequency R times F, where R is an integer greater than two, and having an output terminal at which sampled data signals representing said composite signal are available;

signal combining means having a first input terminal coupled to the output terminal of said sampling means, having a second input terminal and an output terminal;

first signal scaling circuitry coupled to the output terminal of said signal combining means, having a plurality of output terminals at which a plurality of scaled samples are available, said plurality of scaled samples representing said sampled data signal scaled by factors corresponding to the sines of angular increments of $2\pi/R$;

switching signal generating means responsive to said sampling signal for generating reciprocating sequences of switching signals;

first multiplexing means having respective input terminals coupled to said plurality of output terminals, having an output terminal and a control input bus coupled to said switching signal generating means, for selectively sequentially applying said plurality of scaled samples to its output terminal in an order to effect multiplication of said sampled data signal by a sinusoid that is substantially quadrature phase related to said pilot signal;

means, including a controlled oscillator, coupled to the output terminal of said first multiplexing means, for generating said sampling signal;

second multiplexing means having respective input terminals coupled to said plurality of output terminals, having an output terminal and a control input bus coupled to said switching signal generating means, for selectively sequentially applying said plurality of scaled samples to its output terminal in an order to effect multiplication of said sampled data signal by a sinusoid substantially in phase with said pilot signal;

signal averaging means having an input terminal coupled to the output terminal of said second multiplexing means, and having an output terminal;

second signal scaling circuitry, coupled to the output terminal of said signal averaging means, having a plurality of output terminals at which a plurality of scaled samples are available, said plurality of scaled samples representing sample averages from said averaging means scaled by factors corresponding to the sines of angular increments of $2\pi/R$;

third multiplexing means having respective input terminals coupled to said plurality of output terminals of said second scaling circuitry, having an output terminal coupled to the second input terminal of said signal combining means, and a control bus coupled to said switching signal generating means, for selectively sequentially applying said plurality of scaled sample averages to its output terminal in an order to effect multiplication of said sample averages by a sinusoid substantially in phase with said pilot signal.

4. The sampled data system set forth in claim 3 wherein said switching signal generating means includes a counter having parallel outputs, each of which produces mutually exclusive switching pulses.

5. The sampled data system set forth in claim 3 wherein said sampling means includes an analog-to-digital converter and said sampled data signals are PCM sampled data signals.

* * * * *

UNITED STATES PATENT AND TRADEMARK OFFICE
CERTIFICATE OF CORRECTION

PATENT NO. : 4,731,844
DATED : March 15, 1988
INVENTOR(S) : Christopher

It is certified that error appears in the above-identified patent and that said Letters Patent is hereby corrected as shown below:

Column 1 line 23 should read "corresponding" instead of "c--orresponding"

Column 2 line 13 should read "embodying the" instead of "embodiment of the"

Column 3 line 22, "$_D t)$" should be deleted

Column 3 line 56 should read "$\text{Å}$ degrees" instead of "a degrees"

Column 4 line 67 should read "code" instead of "cod"

Column 7 line 23 should read "$S_{18}$" instead of "S18"

Column 7 line 24 should read "$S_{18}$" instead of "S18"

Column 7 line 25 should read "is approximated" instead of "is S approximated"

Column 10 line 12 should read "$T_0 - T_9$" instead of "$T_0 - T_9$"

Signed and Sealed this

Fifteenth Day of November, 1988

*Attest:*

DONALD J. QUIGG

*Attesting Officer*   *Commissioner of Patents and Trademarks*